(12) United States Patent
Harris

(10) Patent No.: US 6,288,555 B1
(45) Date of Patent: Sep. 11, 2001

(54) FIXTURE FOR USE IN MEASURING AN ELECTRICAL CHARACTERISTIC OF A POGO PIN

(75) Inventor: Daniel L. Harris, Beaverton, OR (US)

(73) Assignee: Credence Systems Corporation, Fremont, CA (US)

(*) Notice: Subject to any disclaimer, the term of this patent is extended or adjusted under 35 U.S.C. 154(b) by 0 days.

(21) Appl. No.: 09/265,201

(22) Filed: Mar. 10, 1999

Related U.S. Application Data

(63) Continuation-in-part of application No. 08/897,729, filed on Jul. 21, 1997, now abandoned.

(51) Int. Cl.⁷ .............................. G01R 27/04; G01R 31/02
(52) U.S. Cl. ............................................. 324/637; 324/761
(58) Field of Search ...................................... 324/637, 758, 324/754, 158, 761; 439/66, 59

(56) References Cited

U.S. PATENT DOCUMENTS

| | | | |
|---|---|---|---|
| 4,588,241 | * 5/1986 | Ardezzone | 439/581 |
| 5,645,433 | * 7/1997 | Johnson | 439/66 |
| 5,688,127 | * 11/1997 | Staab et al. | 439/66 |

* cited by examiner

*Primary Examiner*—Safet Metjahic
*Assistant Examiner*—J Kerveros
(74) *Attorney, Agent, or Firm*—John Smith-Hill; Smith-Hill and Bedell

(57) ABSTRACT

An electrical parameter of a rod-form conductive element is measured using a measurement fixture which includes an insulating support on which a first conductive element is mounted. A transmission line connector mounted on the insulating support and has a signal conductor connected to a first conductive element mounted on the support member. A holder for removably receiving the rod-form element includes a conductive member which is in electrically conductive contact with the rod-form element when the latter is positioned in the holder. The holder is mounted relative to the support member by a mounting structure such that when the rod-form element is positioned in the holder, an end of the rod-form element can be brought into electrically conductive contact with the first conductive element. The mounting structure includes a resistor structure electrically connected between the conductive member of the holder and the ground conductor of the transmission line connector and having an electrical resistance substantially equal to the characteristic impedance of the transmission line connector.

9 Claims, 1 Drawing Sheet

FIXTURE FOR USE IN MEASURING AN ELECTRICAL CHARACTERISTIC OF A POGO PIN

CROSS-REFERENCE TO RELATED APPLICATION

This application is filed as a continuation-in-part of co-pending patent application Ser. No. 08/897,729 filed Jul. 21, 1997, now abandoned.

BACKGROUND OF THE INVENTION

This invention relates to a fixture for use in measuring an electrical characteristic of a pogo pin.

In a semiconductor tester, stimulus and response signals are applied to and received from the device under test (DUT) by a test head. The DUT is mounted on a load board having contact pads connected to the pins of the DUT. The test head is equipped with spring-loaded contact elements known as pogo pins. A pogo pin is composed of a socket which is firmly secured in an insulating member, such as a plastic header or a circuit board, a barrel which is press fit into the socket, a plunger which is a sliding fit inside the barrel, and a spring inside the barrel and urging the plunger toward a projecting position. The load board is positioned so that the tips of the plungers are in contact with the conductive pads on the load board and the load board is then displaced toward the test head, establishing electrically conductive pressure contact between the tip of each plunger and the respective contact pad.

It is necessary for reliable and accurate operation of the tester that the electrical characteristics of the pogo pins, specifically the impedance of the pogo pins, lie within a fairly narrow range and be known with fairly high degree of accuracy.

Impedance has a frequency-independent resistive component and a frequency-dependent reactive component. Manufacturers of pogo pins conventionally specify only the resistance of a pogo pin.

In a high speed test of an integrated circuit device, frequency components of 500 MHz or higher may be involved, and in this case it may be desirable that the signal path between the test head and the DUT have a bandwidth greater than 1 GHz. The resistance value specified for a pogo pin is of no substantial relevance to the behavior of the pin at such high frequencies. For example, ideally there is a good sliding electrical contact between the plunger and the barrel but if there is instead a poor sliding electrical contact between the plunger and the barrel, and a significant part of the signal energy passes through the spring, the inductance of the spring may contribute a large reactive component of impedance that far outweighs the resistance of the pogo pin.

A time domain reflectometer (TDR) or a network analyzer can be used to measure high frequency electrical behavior of a conductive element. However, it is very difficult to couple the barrel or plunger of a pogo pin to a time domain reflectometer or network analyzer.

SUMMARY OF THE INVENTION

In accordance with a first aspect of the invention there is provided a measurement fixture for use in measuring an electrical parameter of a rod-form conductive element, comprising an insulating support member, a transmission line connector having ground and signal conductors for connection to a measurement instrument, said transmission line connector being mounted on the insulating support member, a first conductive element mounted on the support member and connected to the signal conductor of the transmission line connector, a holder for removably receiving the rod-form element, said holder including a conductive member in electrically conductive contact with the rod-form element when positioned in the holder, and a mounting structure mounting the holder relative to the support member so that when the rod-form element is positioned in the holder, an end of the rod-form element can be brought into electrically conductive contact with the first conductive element, said mounting structure including a resistor structure electrically connected between the conductive member of the holder and the ground conductor of the transmission line connector and having an electrical resistance substantially equal to the characteristic impedance of the transmission line connector.

In accordance with a second aspect of the invention there is provided a method of testing a rod-form conductive element, comprising providing a measurement fixture including an insulating support member, a transmission line connector having ground and signal conductors for connection to a measurement instrument, said transmission line connector being mounted on the insulating support member, a first conductive element mounted on the support member and connected to the signal conductor of the transmission line connector, a holder for removably receiving the rod-form element, said holder including a conductive member in electrically conductive contact with the rod-form element when positioned in the holder, and a mounting structure mounting the holder relative to the support member so that when the rod-form element is positioned in the holder, an end of the rod-form element can be brought into electrically conductive contact with the first conductive element, said mounting structure including a resistor structure electrically connected between the conductive member of the holder and the ground conductor of the transmission line connector and having an electrical resistance substantially equal to the characteristic impedance of the transmission line connector, fitting the rod-form element in the holder and sliding the rod-form element to a position in which an end of the rod-form element engages the first conductive element, and employing the measurement instrument to launch a stimulus signal into the rod-form element by way of the transmission line connector and measure a response signal received therefrom.

In accordance with a third aspect of the invention there is provided a method of testing rod-form conductive elements, comprising (a) providing a measurement fixture including an insulating support member, a transmission line connector having ground and signal conductors for connection to a measurement instrument, said transmission line connector being mounted on the insulating support member, a first conductive element mounted on the support member and connected to the signal conductor of the transmission line connector, a holder for receiving the rod-form element, said holder including a conductive member in electrically conductive contact with the rod-form element when positioned in the holder, and a mounting structure mounting the holder relative to the support member so that when the rod-form element is positioned in the holder, an end of the rod-form element can be brought into electrically conductive contact with the first conductive element, said mounting structure including a resistor structure electrically connected between the conductive member of the holder and the ground conductor of the transmission line connector and having an electrical resistance substantially equal to the characteristic impedance of the transmission line connector, (b) fitting a first rod-form element in the holder, (c) sliding the rodform element to a position in which an end of the rod-form element engages the first conductive element, (d) employing the measurement instrument to launch a stimulus signal into the rod-form element by way of the transmission line connector and measure a response signal received therefrom, (e) removing the rod-form element from the holder, (f) fitting a second rod-form element in the holder, and (g) repeating steps (c)–(e).

BRIEF DESCRIPTION OF THE DRAWINGS

For a better understanding of the invention, and to show how the same may be carried into effect, reference will now be made, by way of example, to the accompanying drawings, in which.

DETAILED DESCRIPTION

Figure 1:
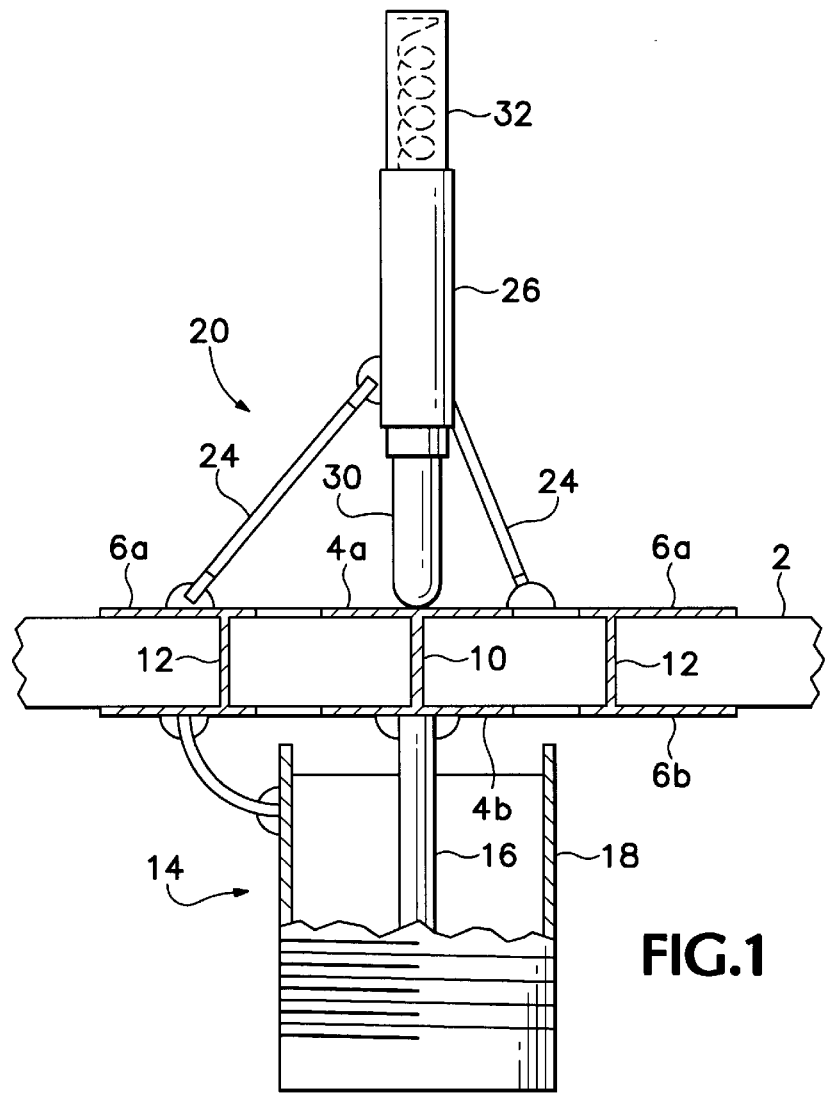
FIG. 1 is a partial sectional view of a measurement fixture in accordance with the present invention.
Figure 2:
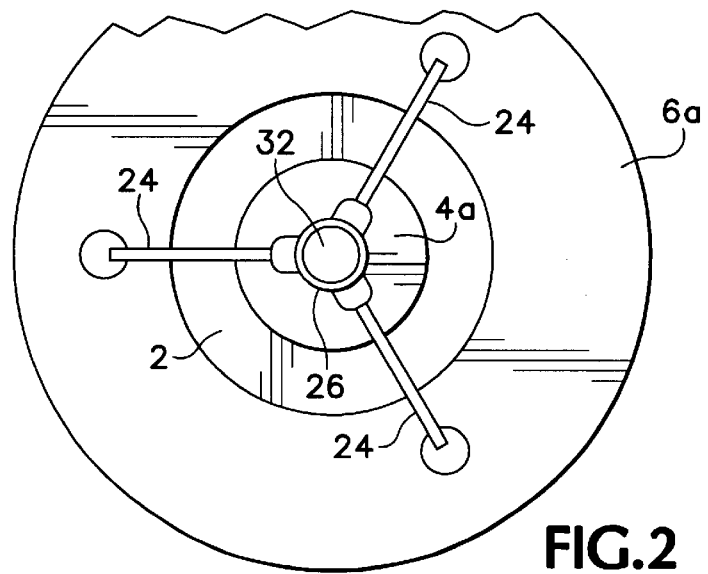
FIG. 2 is a top plan view of the measurement fixture.

The measurement fixture illustrated in the drawings comprises a printed circuit board substrate 2 having an inner circular conductive pad 4 on each side and an outer annular conductor 6 on each side. The inner circular pads 4a, 4b are connected together by conductive vias 10 through the circuit board substrate and similarly the outer annular conductors 6a, 6b are connected together by conductive vias 12. A standard SMA coaxial connector 14 is mounted to the lower side of the circuit board substrate 2, with the center conductor 16 soldered to the circular pad 4b and the outer conductor 18 connected to the annular conductor 6b. The SMA connector is connected to the front panel connector of a measurement instrument, such as a TDR or network analyzer, using a coaxial cable (not shown).

At the upper side of the circuit board substrate 2 is a support structure 20 composed of several equiangularly spaced chip resistors 24 extending upward from the annular conductor 6a and converging toward a line that is perpendicular to the upper side of the substrate 2 and passes through the common center of the circular pad 4a and the annular conductor 6a. The resistors 24 are soldered at their lower ends to the annular conductor 6a and an electrically conductive holding sleeve 26 is soldered to the resistors at their upper ends. The resistance of the support structure is equal to the characteristic impedance of the coaxial cable that connects the SMA connector to the front panel connector of the measurement instrument. In the illustrated fixture, the support structure 20 is composed of three 150 Ω resistors so that the resistance of the support structure 20 is 50 Ω.

The measurement instrument is calibrated at the point of connection to the SMA connector 14 using suitable calibration standards, i.e. short, open and 50 ohm load.

Once the measurement instrument has been calibrated, a rod-form conductive element is inserted in the holding sleeve 26. The internal diameter of the holding sleeve is selected so that the rod-form conductive element is a sliding fit in the holding sleeve. The rod-form conductive element may be the barrel and plunger assembly of a pogo pin under test. The barrel of a typical pogo pin has an external diameter of about 1 mm, i.e. in the range 1–1.2 mm, and has a length of about 17 mm, i.e. in the range 15–20 mm. At zero compression, the overall length of the barrel and plunger assembly is about 21 mm, i.e. in the range 18–23 mm, and the plunger projects from the barrel by about 4 mm, i.e. in the range 3.5–4.2 mm.

In the event that the measurement fixture is used to measure electrical characteristics of the barrel and plunger assembly of a pogo pin, the barrel and plunger assembly of the pogo pin under test is inserted in the holding sleeve 26, with the plunger 30 toward the circuit board substrate, as shown in FIG. 1, and the barrel 32 a sliding fit in the holding sleeve 26. The distance of the holding sleeve from the circuit board is slightly greater than the amount by which the plunger projects from the barrel at zero compression so that an operator can readily judge the extent to which the pogo pin has been compressed. The length of the holding sleeve is sufficient to hold the barrel and plunger assembly perpendicular to the circuit board without being so great as to interfere with application of compressive force to the upper end of the barrel. Axial force is applied to the upper end of the barrel, and the manner in which the frequency dependent electrical characteristics of the pogo pin vary with compression of the pogo pin can easily be measured using the calibrated measurement instrument to launch a stimulus signal into the barrel and plunger assembly by way of the coaxial cable and the connector 14 and measure a response signal received from the pogo pin. It is possible to draw inferences regarding the structure of the pogo pin from the measurements. For example, if the inductive reactance dominates over the resistance, it can be inferred that there is a poor sliding electrical contact between the plunger of the pogo pin and the barrel.

When applying axial force to the pogo pin, it is necessary to ensure that a slight lateral force is applied to ensure that the barrel 32 is in good electrically conductive contact with the holding sleeve 26.

The measurement fixture described above can be used in conjunction with a mechanism for progressively applying an increasing compression force to the pogo pin under test so that the frequency dependent characteristics of the pogo pin can be measured at multiple compression levels to allow comprehensive characterization of the pogo pin.

The measurement fixture and the measurement method described above can be used for characterizing a specific pogo pin, in order to determine whether it meets established requirements for use in a semiconductor tester, or for measuring characteristics of sample devices in a production run of nominally identical devices in order to provide statistical information regarding the production run and allow a manufacturer to specify with a high degree of confidence that the characteristics of the devices meet prescribed standards.

When characteristics of multiple devices are measured, for example sample devices in a production run of nominally identical devices, the barrel and plunger assembly of a first pogo pin is fitted in the holder and is advanced slidingly into a position in which the plunger engages the pad 4a and the manner in which the frequency dependent electrical characteristics of the barrel and plunger assembly vary with compression are measured using the calibrated measurement instrument, as described above. The first barrel and plunger assembly is removed from the holder sleeve 26 and the operation is repeated with the barrel and plunger assembly of a second pogo pin, and so on. In this manner, electrical characteristics of multiple devices can be measured successively.

It will be appreciated that the invention is not restricted to the particular embodiment that has been described, and that variations may be made therein without departing from the scope of the invention as defined in the appended claims and equivalents thereof. For example, although the support structure 20 is composed of three resistors, it will be appreciated that if more resistors were used, the inductance of the support structure could be reduced. For example, four resistors of 200 Ω each would provide the same resistance as three resistors of 150 Ω but would have a lower inductance.

What is claimed is:

1. A measurement fixture for use in measuring an electrical parameter of a rod-form conductive element, the measurement fixture comprising:
   an insulating support member,
   a transmission line connector having ground and signal conductors for connection to a measurement instrument, said transmission line connector being mounted on the insulating support member,
   a first conductive element mounted on the support member and connected to the signal conductor of the transmission line connector,
   a holder for removably receiving the rod-form element, said holder including a conductive member in electrically conductive contact with the rod-form element when positioned in the holder, and
   a mounting structure mounting the holder relative to the support member so that when the rod-form element is positioned in the holder, an end of the rod-form element can be brought into electrically conductive contact with the first conductive element, said mounting structure including a resistor structure electrically connected between the conductive member of the holder and the ground conductor of the transmission line connector and having an electrical resistance substantially equal to the characteristic impedance of the transmission line connector.

2. A measurement fixture according to claim 1, wherein the resistor structure comprises n equiangularly spaced legs (n>=3), each leg being composed of a resistive element of which the resistance is substantially n times the characteristic impedance of the transmission line connector.

3. A measurement fixture according to claim 2, wherein the insulating support member has first and second opposite sides, the first conductive element is at the first side of the support member, the transmission line connector is at the second side of the support member, the fixture further comprises a second conductive element at the first side of the support member and defining an aperture, the first conductive element is located in said aperture and is spaced from the second conductive element, and the legs of the resistor structure project from the second conductive element.

4. A measurement fixture according to claim 2, comprising a second conductive element defining an aperture and wherein the first conductive element is located in said aperture and is spaced from the second conductive element and the legs of the resistor structure project from the second conductive element.

5. A measurement fixture according to claim 1, wherein the transmission line connector comprises an inner conductor connected to the first conductive element and an outer conductor coaxial with the inner conductor and connected to a second conductive element.

6. A measurement fixture according to claim 1, wherein said transmission line connector is mounted on the insulating support member at one side thereof and the first conductive element is mounted on the support member at an opposite side thereof and is connected to the signal conductor through a via in the support member.

7. A measurement fixture according to claim 1, wherein the insulating support member has first and second opposite sides, the first conductive element is at the first side of the support member and the transmission line connector is at the second side of the support member.

8. A method of testing a rod-form conductive element, comprising:
   providing a measurement fixture including an insulating support member, a transmission line connector having ground and signal conductors for connection to a measurement instrument, said transmission line connector being mounted on the insulating support member, a first conductive element mounted on the support member and connected to the signal conductor of the transmission line connector, a holder for removably receiving the rod-form element, said holder including a conductive member in electrically conductive contact with the rod-form element when positioned in the holder, and a mounting structure mounting the holder relative to the support member so that when the rod-form element is positioned in the holder, an end of the rod-form element can be brought into electrically conductive contact with the first conductive element, said mounting structure including a resistor structure electrically connected between the conductive member of the holder and the ground conductor of the transmission line connector and having an electrical resistance substantially equal to the characteristic impedance of the transmission line connector,
   fitting the rod-form element in the holder and sliding the rod-form element within the holder from a first position in which an end of the rod-form element is spaced from the first conductive element to a second position in which the end of the rod-form element engages the first conductive element, and
   employing the measurement instrument to launch a stimulus signal into the rod-form element by way of the transmission line connector and measure a response signal received therefrom.

9. A method of testing rod-form conductive elements, comprising:
   (a) providing a measurement fixture including an insulating support member, a transmission line connector having ground and signal conductors for connection to a measurement instrument, said transmission line connector being mounted on the insulating support member, a first conductive element mounted on the support member and connected to the signal conductor of the transmission line connector, a holder for receiving the rod-form element, said holder including a conductive member in electrically conductive contact with the rod-form element when positioned in the holder, and a mounting structure mounting the holder relative to the support member so that when the rod-form element is positioned in the holder, an end of the rod-form element can be brought into electrically conductive contact with the first conductive element, said mounting structure including a resistor structure electrically connected between the conductive member of the holder and the ground conductor of the transmission line connector and having an electrical resistance substantially equal to the characteristic impedance of the transmission line connector,
   (b) fitting a first rod-form element in the holder,
   (c) sliding the rod-form element to a position in which an end of the rod-form element engages the first conductive element,
   (d) employing the measurement instrument to launch a stimulus signal into the rod-form element by way of the transmission line connector and measure a response signal received therefrom,
   (e) removing the rod-form element from the holder,
   (f) fitting a second rod-form element in the holder, and
   (g) repeating steps (c)–(e).

* * * * *